(12) United States Patent
Tsai et al.

(10) Patent No.: US 6,462,357 B1
(45) Date of Patent: Oct. 8, 2002

(54) EPITAXIAL GROWTH OF NITRIDE COMPOUND SEMICONDUCTOR

(75) Inventors: Tzong-Liang Tsai, Hsinchu; Chih-Sung Chang, Taipei, both of (TW)

(73) Assignee: United Epitaxy Company, Ltd., Hsinchu (TW)

( * ) Notice: Subject to any disclaimer, the term of this patent is extended or adjusted under 35 U.S.C. 154(b) by 0 days.

(21) Appl. No.: 09/750,351

(22) Filed: Dec. 29, 2000

(30) Foreign Application Priority Data

Nov. 16, 2000 (TW) .......................... 89124233 A

(51) Int. Cl.[7] .................. H01L 33/00; H01L 29/205
(52) U.S. Cl. ..................... 257/97; 257/103; 257/190
(58) Field of Search ................... 257/97, 103, 190

(56) References Cited

U.S. PATENT DOCUMENTS 6,261,931 B1 * 7/2001 Keller .................. 438/492

* cited by examiner

*Primary Examiner*—Jerome Jackson, Jr.
(74) *Attorney, Agent, or Firm*—Arent Fox Kintner Plotkin & Kahn

(57) ABSTRACT

The present invention provides materials and structures to reduce dislocation density when growing a III-nitride compound semiconductor. A II-nitride compound single crystal-island layer is included in the semiconductor structure, and III-nitride compound semiconductor layers are to grow thereon. It reduces the dislocation density resulted from the difference between the lattice constants of the GaN compound semiconductor layers and the substrate. It also improves the crystallization property of the III-nitride compound semiconductor.

21 Claims, 6 Drawing Sheets

EPITAXIAL GROWTH OF NITRIDE COMPOUND SEMICONDUCTOR

FIELD OF THE INVENTION

The present invention provides a III-nitride compound semiconductor device, which is characterized by having a II-nitride compound crystal-island layer in the structure to reduce dislocation of the III-nitride compound occurred during epitaxial growth.

BACKGROUND OF THE INVENTION

III-nitride compound semiconductors, especially semiconductors with GaN-based material are frequently applied to produce light emitting devices such as blue-green light emitting diodes (LED) and laser diodes. These materials usually grow on aluminum oxide ($Al_2O_3$) substrates or silicon carbide (SiC) substrates.

Take the aluminum oxide substrates for example. Because the difference between the lattice constants of $Al_2O_3$ substrates and GaN exceeds 16%, a GaN crystal layer is hard to directly grow on an $Al_2O_3$ substrate. In U.S. Pat. No. 4,855,249, therefore, Akasaki et al. first disclosed to grow an amorphous AlN buffer layer on an $Al_2O_3$ substrate at a low temperature so as to reduce problem caused by the lattice constant difference between an $Al_2O_3$ substrate and a GaN layer. Nakamura et al., in U.S. Pat. No. 5,290,393, disclosed to use materials such as GaN or AlGaN to grow as a buffer layer. An amorphous GaN buffer layer was first growing on an $Al_2O_3$ substrate at a temperature between 400° C. and 900° C. A GaN epitaxy layer was then growing on the GaN buffer layer at a temperature between 1000° C. and 1200° C. The quality and performance of the GaN epitaxy layer were better than those of a GaN epitaxy layer produced by adopting AlN as a buffer layer.

However, because of dislocation defects caused by the difference between the lattice contants of $Al_2O_3$ substrates and GaN materials, even GaN-based, AlGaN-based or AlN-based materials are provided as buffer layer materials, epitaxy layer with GaN-based material still has a dislocation density of $10^{10}$ $cm^{-2}$ to $10^8$ $cm^{-2}$. This leads to a bad performance of the semiconductor device and affects illumination and electrical property. Thus, methods on how to reduce dislocation density, such as multiple buffer layer structure, epitaxy lateral overgrowth (ELOG) structure, InGaN/GaN superlattice structure, or AlGaN/GaN suprelattice structure, are brought up one after another to reduce dislocation.

SUMMARY OF THE INVENTION

The present invention provides a II-nitride compound material to grow directly on the substrate. This II-nitride compound material grows evenly on the substrate or on the III-nitride compound material with crystal-island structure. The III-nitride compound semiconductor layer is to grow thereon to reduce dislocation of the III-nitride semiconductor layer and improve the epitaxy quality.

The present invention discloses a light emitting device with a single crystal island structure. The materials of the single crystal-island layer are II-nitride compounds, wherein the II-group elements include beryllium (Be), magnesium (Mg), calcium (Ca), strontium (Sr), barium (Ba), zinc (Zn), cadmium (Cd), and mercury (Hg) etc. The single crystal-island layer grows on the substrate with a certain distance between each two of the single crystal islands. III-nitride compound semiconductor layer then grows on the single crystal-island layer. Because III-nitride compound semiconductor layer grows along II-nitride compound single crystal islands, dislocation occurred during epitaxy is to be confined to where II-nitride compound single crystal island is. Hence, dislocation density is to be reduced effectively.

DETAILED DESCRIPTION OF THE INVENTION

The present invention provides a III-nitride compound semiconductor device characterized by having at least one II-nitride compound single crystal-island layer in the structure. This reduces the dislocation of the III-nitride compound occurred during epitaxy.

According to the present invention, III–V compound semiconductor layers, such as $Al_xIn_yGa_{1-x-y}N$ layers ($0 \leq x+y \leq 1$), grow on $Al_2O_3$ substrates, SiC substrates, GaAs substrates or Si substrates by means of hydride vapor phase epitaxy (HVPE), organometallic vapor phase epitaxy (OMVPE), or molecular beam epitaxy (MBE). The source of Ga is TMGa or TEGa; the source of Al is TMAl or TEAl; the source of In is TMIn or TEIn; the source of N is $NH_3$ or dimethylhydrazine ($DMeNNH_2$). P-type dopant is selected from the group consisting of Zn, Cd, Be, Mg, Ca, and Ba; N-type dopant is selected from the group consisting of Te, Si, Ge, and Sn. II-group elements are selected from the group consisting of Be, Mg, Ca, Sr, Ba, Zn, Cd, and Hg.

Figure 1:
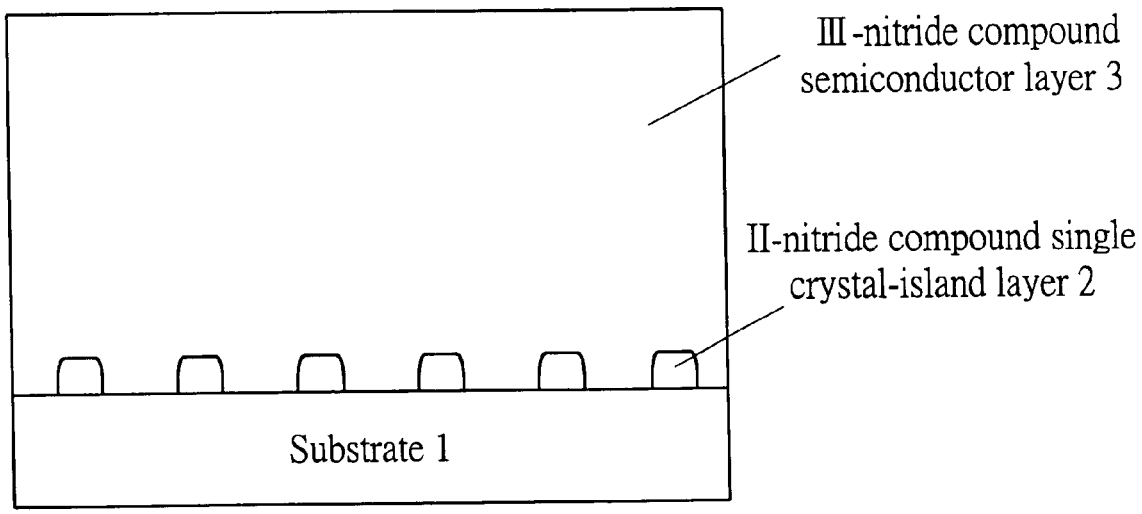
FIG. 1 illustrates the III-nitride compound semiconductor structure with the single crystal islands grown from the II-nitride compounds according to the present invention.

FIG. 1 illustrates the III-nitride compound semiconductor structure with the single crystal islands grown from the II-nitride compounds according to the present invention. Single crystal-island layer 2, with the material of II-nitride compound, grows on the substrate 1 of $Al_2O_3$, SiC, GaAs or Si. By adjusting the growing temperature and the growing time of the II-nitride compound, the number and the sizes of the single crystal islands in the single crystal-island layer 2 may be controlled, If the growing temperature is between 200° C. and 1200° C. and the growing time is between 5 seconds and 30 minutes, the density of the single crystal islands may be controlled to be $10^7$ $cm^{-2}$ or lower. The number of the islands in the II-nitride compound single crystal-island layer 2 decides the number of dislocation defects, while the sizes of the islands in the II-nitride compound single crystal-island layer 2 affect the epitaxy property of the III-nitride compound semiconductor layer 3. When the II-nitride compound single crystal-island layer 2 finishes growing on the wafer, the III-nitride compound semiconductor layer 3 continues to grow on it. The III-nitride compound semiconductor layer 3 is to grow along the single crystal islands in the II-nitride compound single crystal-island layer 2, and dislocation is to occur between each two of the single crystal islands. This effectively reduces the number of dislocation defects.

Figure 2:
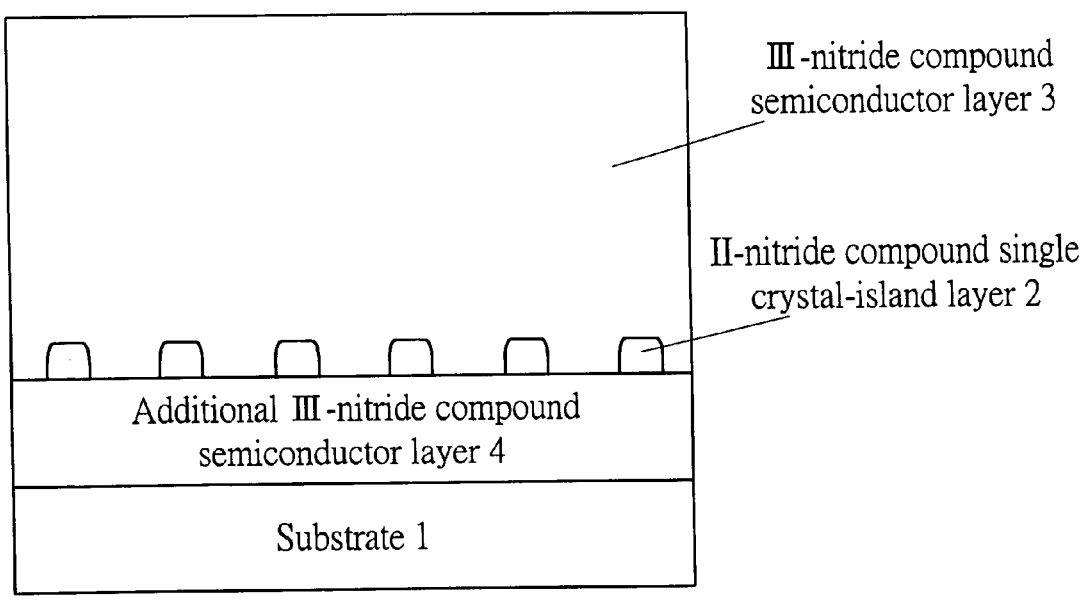
FIG. 2 illustrates one of the embodiments of the semiconductor device according to the present invention.

FIG. 2 illustrates one of the embodiments of the semiconductor device according to the present invention. First, an additional III-nitride compound semiconductor layer 4 grows on the substrate 1. This additional III-nitride compound semiconductor layer 4 has a higher dislocation density. Second, a II-nitride compound single crystal-island layer 2 grows on the additional III-nitride compound semiconductor layer 4. By adjusting the growing temperature and the growing time of the II-nitride compound single crystal-island layer 2, the number and the sizes of the single crystal islands in the single crystal-island layer 2 may be controlled. If the growing temperature is between 200° C. and 1200° C. and the growing time is between 5 seconds and 30 minutes, the density of the single crystal islands may be controlled to be $10^7$ cm$^{-2}$ or lower. The III-nitride compound semiconductor layer 3 then continues to grow on the II-nitride compound single crystal-island layer 2. This effectively reduces the number of dislocation defects. The advantage of this structure is that the III-nitride compound semiconductor layer 3 lies on the II-nitride compound single crystal-island layer 2, and it makes the III-nitride compound semiconductor layer 3 grow more easily from the additional III-nitride compound semiconductor layer 4. Therefore the epitaxy quality of GaN may be improved.

Figure 3:
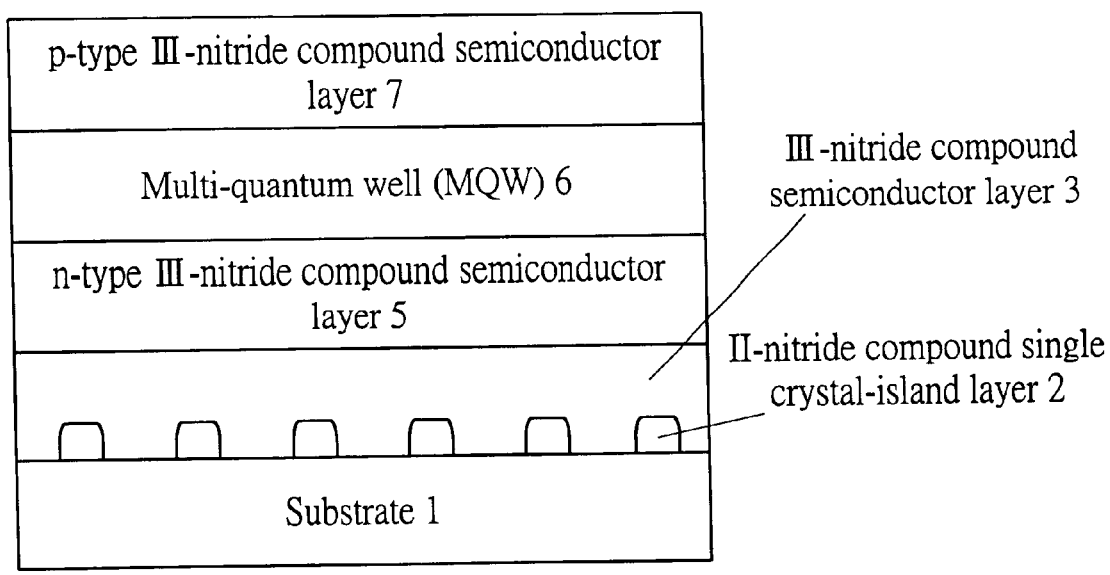
FIG. 3 illustrates the first embodiment of the light emitting semiconductor device according to the present invention.
Figure 4:
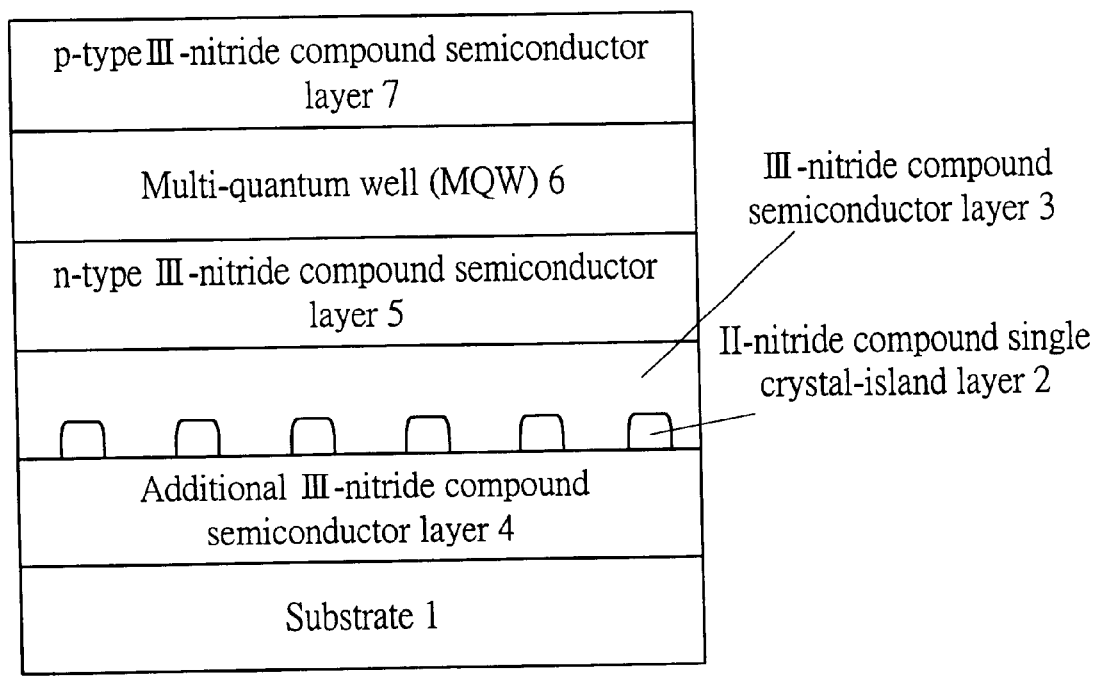
FIG. 4 illustrates the second embodiment of the light emitting semiconductor device according to the present invention.

FIG. 3 and FIG. 4 illustrate two different embodiments of the light emitting semiconductor device according to the present invention, wherein an additional III-nitride compound semiconductor layer 4 grows on the substrate 1 of the semiconductor device shown in FIG. 4. The n-type III-nitride compound semiconductor layer 5 grows on the III-nitride compound semiconductor layer 3 with the structure of the II-nitride compound single crystal-island layer 2. The n-type dopant of the n-type III-nitride compound semiconductor layer 5 is selected from the group consisting of SiH$_4$ and S$_2$H$_6$, and the electron carrier concentration is between 1 ×10$^{17}$ cm$^{-3}$ and 1×10$^{20}$ cm$^{-3}$. Then, the light emitting region, with In as the semiconductor compound material, grows on the n-type III-nitride compound semiconductor layer 5. The structure of this layer may be double heterostructure, single quantum well, or multi-quantum well 6. The p-type III-nitride compound semiconductor layer 7 then grows on the light emitting region and thus completes the LED structure. The dopant of the p-type III-nitride compound semiconductor layer 7 is selected from the group consisting of Mg and Zn etc., and the hole carrier concentration is between 1×10$^{17}$ cm$^{-3}$ and 5×10$^{19}$ cm$^{-3}$. The forward voltage of the LED is between 3.0 V and 3.4 V, which is about 0.5 V to 1.0 V lower than that of the LED without the II-nitride compound single crystal-island layer 2.

Figure 5:
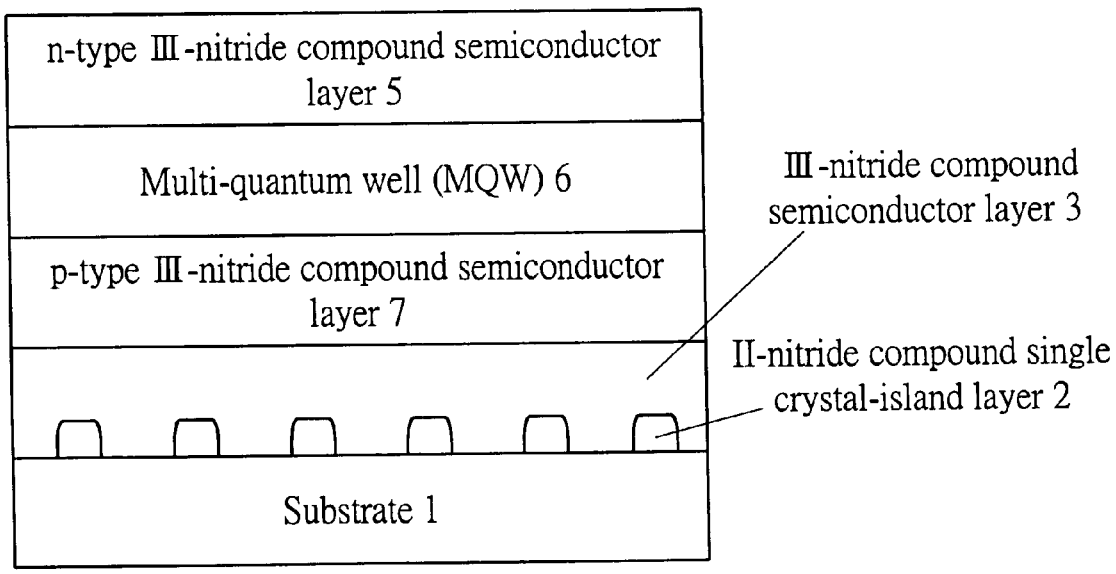
FIG. 5 illustrates the third embodiment of the light emitting semiconductor device according to the present invention.
Figure 6:
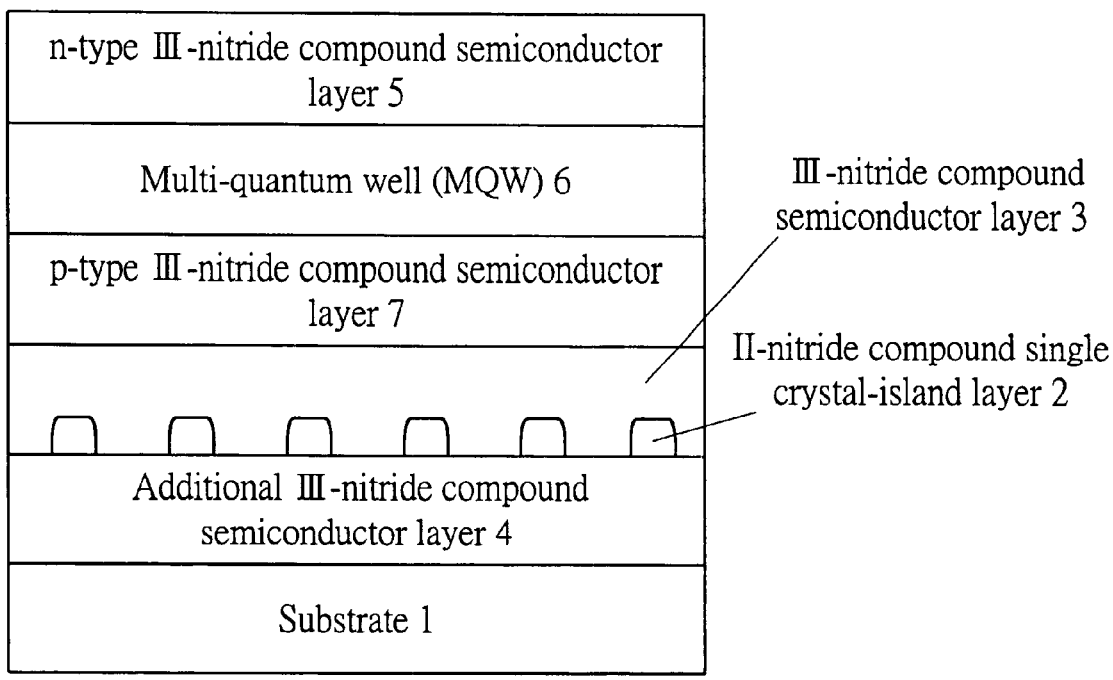
FIG. 6 illustrates the fourth embodiment of the light emitting semiconductor device according to the present invention.

FIG. 5 and FIG. 6 illustrate another two different embodiments of the light emitting semiconductor device according to the present invention, wherein an additional III-nitride compound semiconductor layer 4 grows on the substrate 1 of the semiconductor device shown in FIG. 6. The p-type III-nitride compound semiconductor layer 7 grows on the III-nitride compound semiconductor layer 3 with the structure of the II-nitride compound single crystal-island layer 2. The dopant of the p-type III-nitride compound semiconductor layer 7 is selected from the group consisting of Mg and Zn etc., and the hole carrier concentration is between 1×10$^{17}$ cm$^{-3}$ and 5×10$^{19}$ cm$^{-3}$. Then, the light emitting region, with In as the semiconductor compound material, grows on the p-type III-nitride compound semiconductor layer 7. The structure of this layer may be double heterostructure, single quantum well, or multi-quantum well 6. The n-type III-nitride compound semiconductor layer 5 then grows on the light emitting region and thus completes the LED structure. The n-type dopant of the n-type III-nitride compound semiconductor layer 5 is selected from the group consisting of SiH$_4$ and S$_2$H$_6$, and the electron carrier concentration is between 1 ×10$^{17}$ cm$^{-3}$ and 1×10$^{20}$ cm$^{-3}$. The forward voltage of the LED is between 3.0 V and 3.4 V, which is about 0.5 V to 1.0 V lower than that of the LED without the II-nitride compound single crystal-island layer 2.

The present invention provides a structure to reduce dislocation defects of the semiconductor layers. The II-nitride compound single crystal-island layer is to grow on the substrate or on the III-V compound semiconductor layer to effectively reduce dislocation of the III-nitride compound semiconductor and to improve the epitaxy quality.

Following examples show different process coefficients to explain the spirit of the present invention in detail.

EXAMPLE 1

An epi-ready Al$_2$O$_3$ substrate is first placed in a reactor. The substrate is preheated at 1150° C. and then hydrogen gas is introduced to clean the wafer surface for 10 minutes. The temperature is then lowered to approximately 510° C. The source of Zn is DMZn and the source of N is NH$_3$. Therefore a mixed gas flow of 63 μmol/min of DMZn and 7.14×10$^{-2}$ mol/min of NH$_3$ is introduced to the reactor, and a single crystal-island layer of ZnN grows on the substrate accordingly. The average diameter of the single crystal islands is about 0.2 μm, and the density of the islands is about 10$^7$ cm$^{-2}$. The temperature is then raised to 1140° C. and another mixed gas flow of 5.97×10$^{-5}$ mol/min of TMGa and 1.34× 10$^{-1}$ mol/min of NH$_3$ is introduced to the reactor, and it results in a 2 μm GaN semiconductor layer. According to the Hall effect measurement, the mobility is about 650 cm$^2$/V-s, and the carrier concentration is −2.65×10$^{16}$ cm$^{-3}$ approximately.

EXAMPLE 2

The epitaxy process of example 2 is similar to that of example 1, wherein DCpMg, as the source of Mg, is substituted for DMZn. Under the growing temperature of 600° C., a gas flow of 56 μmol/min of DCpMg is introduced to the reactor. On the substrate it results in a MgN single crystal-island layer in which the average diameter of the single crystal islands is about 0.2 μm. According to the Hall effect measurement, the mobility is about 635 cm$^2$/V-s, and the carrier concentration is −2.93 ×10$^{16}$ cm$^{-3}$ approximately.

EXAMPLE 3

The pre-treatment of the Al$_2$O$_3$ substrate in example 3 is similar to that in example 1. By adjusting the temperature of the substrate to 530° C. and introducing a mixed gas flow of 1.19×10$^{-5}$ mol/min of TMGa, 5.23×10$^{-6}$ mol/min of TMAl, and 7.14×10$^{-2}$ mol/min of NH$_3$ to the reactor, about 25 nm of AlGaN semiconductor layer is to grow on the substrate. Then turn off the aforementioned mixed gas flow and lower the temperature to 510° C. Furthermore, introduce another mixed gas flow of 63 μmol/min of DMZn and 7.14×10$^{-2}$ mol/min of NH$_3$ to the reactor. It results in a single crystal-island layer of ZnN on the AlGaN semiconductor layer. Now raise the temperature to 1140° C. and introduce a mixed gas flow of 5.97×10$^{-5}$ mol/min of TMGa and 1.34×10$^{-1}$ mol/ min of $NH_3$ to the reactor, and 2 μm of undoped GaN semiconductor layer is then formed thereon. According to the Hall effect measurement, the mobility is about 715 $cm^2$/V-s, and the carrier concentration is $-1.97 \times 10^{16}$ $cm^{-3}$ approximately.

EXAMPLE 4

The epitaxy process of example 4 is similar to that of example 3, wherein $Et_2Be$, as the source of Be, is substituted for DMZn. By adjusting the growing temperature to 450° C. and introducing a mixed gas flow of 75 μmol/min of $Et_2Be$ and $7.14 \times 10^{-2}$ mol/min of $NH_3$, a single crystal-island layer of BeN is then formed. Upon the single crystal-island layer grows the GaN semiconductor layer. According to the Hall effect measurement, the mobility is about 630 $cm^2$/V-s, and the carrier concentration is $3.12 \times 10^{16}$ $cm^{-3}$ approximately.

EXAMPLE 5

Similar to example 1, the ZnN single crystal-island layer and the GaN semiconductor layer grow on the $Al_2O_3$ substrate. A mixed gas flow of $5.97 \times 10^{-5}$ mol/min of TMGa, $1.34 \times 10^{-1}$ mol/min of $NH_3$, and $1.77 \times 10^{-10}$ mol/min of $SiH_4$ is introduced to the reactor, and it results in 2.5 μm of n-type GaN semiconductor layer, doped with Si, on top of the GaN semiconductor layer with the ZnN single crystal-island layer. Then turn off all the gas flows and lower the temperature of the substrate to 820° C. Introduce another mixed gas flow of 8.61 μmol/min of TMGa, 4.73 μmol/min of TMIn, and 0.134 mol/min of $NH_3$ to the reactor, and it results in a light emitting region of the multi-quantum well (MQW) structure. Now turn off all the gas flows and raise the temperature of the substrate to 1110° C. Introduce the other mixed gas flow of 47.5 μmol/min of TMGa, $1.25 \times 10^{-7}$ mol/min of DCpMg, and $8.93 \times 10^{-2}$ mol/min of $NH_3$ to the reactor, and 0.5 μm of p-type GaN semiconductor layer, doped with Mg, is formed accordingly on the light emitting region of the MQW structure. The forward voltage of the LED structure is 3.1 V at 20 mA.

EXAMPLE 6

Similar to example 5, the LED structure grows upon the GaN semiconductor layer with the MgN single crystal-island layer. When made into a wafer, the forward voltage is 3.05 V at 20 mA.

EXAMPLE 7

The epitaxy process of example 4 is similar to that of example 3, wherein DMCd, as the source of Cd, is substituted for DMZn. A gas flow of 75 μmol/min of DMCd is introduced to the reactor at the growing temperature of 680° C., and it results in the GaN semiconductor layer with the CdN single crystal-island layer. Similar to example 5, the LED structure then grows upon the GaN semiconductor layer. When made into a wafer, the forward voltage is 3.2 V at 20 mA.

EXAMPLE 8

The pre-treatment of the $Al_2O_3$ substrate in example 8 is similar to that in example 1. By adjusting the temperature of the substrate to 530° C. and introducing a mixed gas flow of $1.02 \times 10^{-5}$ mol/min of TMIn and $7.14 \times 10^{-2}$ mol/min of $NH_3$ to the reactor, crystal-island layer of InN is to grow on the substrate. Then introduce another gas flow of $5.23 \times 10^{-6}$ mol/min of TMAl to the reactor, and it results in a crystal-island layer of AlInN. The thickness of these two crystal-island layers is 35 nm approximately. Then turn off the TMIn gas while continuing to introduce the TMAl and $NH_3$ gases, and it results in a AlGaN layer with a thickness of 25 nm. Now turn off the TMAl and $NH_3$ gases and lower the temperature to 510° C. Introduce another mixed gas flow of 63 μmol/min of DMZn and $7.14 \times 10^{-2}$ mol/min of $NH_3$ to the reactor, and the ZnN single crystal-island layer grows on the AlN layer accordingly. By raising the temperature to 1000° C. and introducing a mixed gas flow of $5.97 \times 10^{-5}$ mol/min of TMGa and $1.34 \times 10^{-1}$ mol/min of $NH_3$ to the reactor, 0.5 μm of undoped GaN semiconductor layer is formed thereon. Lower the temperature to 600° C. and introduce a mixed gas flow of 57 μmol/min of DCpMg and $7.14 \times 10^{-2}$ mol/min of $NH_3$ to the reactor, and it results in a MgN single crystal-island layer on the GaN layer. Again raise the temperature to 1000° C. and introduce a mixed gas flow of $5.97 \times 10^{-5}$ mol/min of TMGa and $1.34 \times 10^{-1}$ mol/min of $NH_3$ to the reactor, and 0.5 μm of undoped GaN semiconductor layer is formed accordingly. Raise the temperature of the substrate to 1150° C. and introduce a mixed gas flow of $5.97 \times 10^{-5}$ mol/min of TMGa, $1.34 \times 10^{-1}$ mol/min of $NH_3$, and $1.77 \times 10^{-10}$ mol/min of $SiH_4$ to the reactor, and 2.5 μm of n-type GaN semiconductor layer, doped with Si, is then formed. Now turn off all the gas flows and lower the temperature of the substrate to 820° C. A mixed gas flow of 8.61 μmol/min of TMGa, 4.73 μmol/min of TMIn, and 0.134 mol/min of $NH_3$ is introduced to the reactor to have the light emitting region with the MQW structure of InGaN/GaN growing. Then turn off all the gas flows and raise the temperature of the substrate to 1110° C. Introduce another mixed gas flow of 47.5 μmol/min of TMGa, $1.25 \times 10^{-7}$ mol/min of DCpMg, and $8.93 \times 10^{-2}$ mol/min of $NH_3$ to the reactor, and 0.5 μm of p-type GaN semiconductor layer, doped with Mg, is therefore formed on the light emitting region with the MQW structure. The LED structure is now completed, and the forward voltage is 3.3 V at 20 mA.

EXAMPLE 9

The pre-treatment of the $Al_2O_3$ substrate in example 9 is similar to that in example 1. By adjusting the temperature of the substrate to 530° C. and introducing a mixed gas flow of $1.02 \times 10^{-5}$ mol/min of TMIn, $5.23 \times 10^{-6}$ mol/min of TMAl, and $7.14 \times 10^{-2}$ mol/min of $NH_3$ to the reactor, 25 nm of AlInN semiconductor layer is formed on the substrate. Then turn off the mixed gas flow of TMIn, TMAl, and $NH_3$, and raise the temperature to 1050° C. Introduce another mixed gas flow of $5.97 \times 10^{-5}$ mol/min of TMGa and $1.34 \times 10^{-1}$ mol/min of $NH_3$ to the reactor, and 0.5 μm of undoped GaN semiconductor layer is to grow thereon. Lower the temperature of the substrate to 510° C. and introduce a mixed gas flow of 57 μmol/min of DCpMg and $7.14 \times 10^{-2}$ mol/min of $NH_3$ to the reactor, and a MgN single crystal-island layer is to grow on the GaN layer. Raise the temperature to 1050° C. and introduce another mixed gas flow of $5.97 \times 10^{-5}$ mol/min of TMGa and $1.34 \times 10^{-1}$ mol/min of $NH_3$ to the reactor, and 0.5 μm of undoped GaN semiconductor layer is formed. Now raise the temperature to 1100° C. and introduce a mixed gas flow of 47.5 μmol/min of TMGa, $1.25 \times 10^{-7}$ mol/min of DCpMg, and $8.93 \times 10^{-2}$ mol/min of $NH_3$ to the reactor, and 3 μm of p-type GaN semiconductor layer, doped with Mg, is formed on the GaN layer. Turn off all the gas flows and lower the temperature of the substrate to 820° C. Another mixed gas flow of 8.61 μmol/min of TMGa, 4.73 μmol/min of TMIn, and 0.134 mol/min of $NH_3$ is introduced to the reactor, and it results in a light emitting region with the MQW structure of InGaN/GaN. Finally, raise the temperature of the substrate to 1150° C. and introduce a mixed gas flow of $5.97 \times 10^{-5}$ mol/min of TMGa, $1.34 \times 10^{-1}$ mol/min of $NH_3$, and $1.77 \times 10^{-10}$ mol/min of $SiH_4$ to the reactor, and 0.5 μm of n-type GaN semiconductor layer, doped with Si, is formed on the light emitting region with the MQW structure. The LED structure is then completed, and the forward voltage is 3.6 V at 20 mA.

EXAMPLE 10

The pre-treatment of the $Al_2O_3$ substrate in example 10 is similar to that in example 1. By adjusting the temperature of the substrate to 530° C. and introducing a mixed gas flow of 63 μmol/min of DMZn and $7.14 \times 10^{-2}$ mol/min of $NH_3$ to the reactor, a ZnN single crystal-island layer is to be formed on the substrate. Then introduce another mixed gas flow of $5.23 \times 10^{-6}$ mol/min of TMAl and $7.14 \times 10^{-2}$ mol/min of $NH_3$ to the reactor, and 25 nm of AlN semiconductor layer is then formed on the substrate. Now turn off the mixed gas flow of TMAl and $NH_3$, and raise the temperature to 1050° C. Another mixed gas flow of $5.97 \times 10^{-5}$ mol/min of TMGa and $1.34 \times 10^{-1}$ mol/min of $NH_3$ is introduced to the reactor to have 0.5 μm of undoped GaN semiconductor layer growing thereon. Raise the temperature of the substrate to 1150° C. and introduce a mixed gas flow of $5.97 \times 10^{-5}$ mol/min of TMGa, $1.34 \times 10^{-1}$ mol/min of $NH_3$, and $1.77 \times 10^{-10}$ mol/min of $SiH_4$ to the reactor, and it results in 2.5 μm of n-type GaN semiconductor layer doped with Si. Now turn off all the gas flows and lower the temperature of the substrate to 820° C. A mixed gas flow of 8.61 μmol/min of TMGa, 4.73 μmol/min of TMIn, and 0.134 mol/min of $NH_3$ is introduced to the reactor to form a light emitting region with the MQW structure of InGaN/GaN. Finally, turn off all the gas flows and raise the temperature of the substrate to 1110° C. Introduce a mixed gas flow of 47.5μmol/min of TMGa, $1.25 \times 10^{-7}$ mol/min of DCpMg, and $8.93 \times 10^{-2}$ mol/min of $NH_3$ to the reactor, and 0.5 μm of p-type GaN semiconductor layer, doped with Mg, then grows on the light emitting region with the MQW structure. The LED structure is then completed, and the forward voltage is 3.3 V at 20 mA.

EXAMPLE 11

The epitaxy process of example 11 is similar to that of example 10, wherein $Et_2Be$, as the source of Be, is substituted for DMZn. By adjusting the growing temperature to 450° C. and introducing a mixed gas flow of 75 μmol/min of $Et_2Be$ and $7.14 \times 10^{-2}$ mol/min of $NH_3$ to the reactor, a single crystal-island layer of BeN is then formed. Now grow the LED structure thereon in a way similar to example 10, and the forward voltage is 3.5 V at 20 mA.

EXAMPLE 12

The pre-treatment of the $A_2O_3$ substrate in example 12 is similar to that in example 1. By adjusting the temperature of the substrate to 530° C. and introducing a mixed gas flow of $1.02 \times 10^{-5}$ mol/min of TMIn and $7.14 \times 10^{-2}$ mol/min of $NH_3$ to the reactor, a InN single crystal-island layer is to be formed on the substrate. Then introduce $5.23 \times 10^{-6}$ mol/min of TMAl to the reactor, and a AlInN single crystal-island layer is formed thereon. The thickness of these two layers is about 35 nm. Turn off the TMAl gas while continuing to introduce of TMAl and $NH_3$ gases, and 25 nm of AlGaN layer is then formed. Now turn off TMAl and $NH_3$ gases, and lower the temperature to 510° C. Another mixed gas flow of 57 μmol/min of DCpMg and $7.14 \times 10^{-2}$ mol/min of $NH_3$ is introduced to the reactor to have a MgN single crystal-island layer growing on the AlN layer. Raise the temperature to 1050° C. and introduce a mixed gas flow of $5.97 \times 10^{-5}$ mol/min of TMGa and $1.34 \times 10^{-1}$ mol/min of $NH_3$ to the reactor, and it results in 0.5 μm of undoped GaN semiconductor layer thereon. Then raise the temperature of the substrate to 1150° C. and introduce a mixed gas flow of $5.97 \times 10^{-5}$ mol/min of TMGa, $1.34 \times 10^{-1}$ mol/min of $NH_3$, and $1.77 \times 10^{-10}$ mol/min of $SiH_4$ to the reactor, and it results in 2.5 μm of n-type GaN semiconductor layer doped with Si. Now turn off all the mixed gas flows and lower the temperature of the substrate to 820° C. Another mixed gas flow of 8.61 μmol/min of TMGa, 4.73 μmol/min of TMIn, and 0.134 mol/min of $NH_3$ is introduced to the reactor to form a light emitting region with the MQW structure of InGaN/GaN. Finally, turn off all the gas flows and raise the temperature of the substrate to 1110° C. Introduce another mixed gas flow of 47.5 μmol/min of TMGa, $1.25 \times 10^{-7}$ mol/min of DCpMg, and $8.93 \times 10^{-2}$ mol/min of $NH_3$ to the reactor, and 0.5 μm of p-type GaN semiconductor layer, doped with Mg, then grows on the light emitting region with the MQW structure. The LED structure is then completed, and the forward voltage is 3.3 V at 20 mA.

EXAMPLE 13

The epitaxy process of example 13 is similar to that of example 12, wherein DMCd, as the source of Cd, is substituted for DCpMg. By adjusting the growing temperature to 680° C. and introducing a gas flow of 75 μmol/min of DMCd to the reactor, a single crystal-island layer of CdN is then formed. Now grow the LED structure thereon in a way similar to example 12, and the forward voltage is 3.2 V at 20 mA.

The invention has been described herein in terms of several preferred embodiments. Other embodiments of the invention will be apparent to those skilled in the art from consideration of the specification and practice of the invention. Furthermore, certain terminology has been used for the purposes of descriptive clarity, and not to limit the present invention. The embodiments and preferred features described above should be considered exemplary, with the invention being defined by the appended claims.

What is claimed is:

1. A light emitting semiconductor device, comprising:
   a substrate;
   a II-nitride compound single crystal-island layer on said substrate;
   a first III-nitride compound semiconductor layer on said II-nitride compound single crystal-island layer;
   a III-nitride light emitting region on said first III-nitride compound semiconductor layer; and
   a second III-nitride compound semiconductor layer on said III-nitride light emitting region.

2. The light emitting semiconductor device of claim 1, wherein said first III-nitride compound semiconductor layer is an n-type III-nitride compound semiconductor layer; said second III-nitride compound semiconductor layer is a p-type III-nitride compound semiconductor layer.

3. The light emitting semiconductor device of claim 1, wherein the material of said substrate is selected from a group consisting of $Al_2O_3$, SiC, Si, and GaAs.

4. The light emitting semiconductor device of claim 1, wherein said II-nitride compound single crystal-island layer is made of at least one element selected from a group consisting of Be, Mg, Ca, Sr, Ba, Zn, Cd, and Hg.

5. The light emitting semiconductor device of claim 1, wherein the growing temperature of said II-nitride compound single crystal-island layer is between 200° C. and 1200° C.

6. The light emitting semiconductor device of claim 1, wherein the structure of said III-nitride light emitting region is selected from a group consisting of double heterostructure, single quantum well, and multi-quantum well.

7. The light emitting semiconductor device of claim 2, wherein the dopant of said n-type III-nitride compound semiconductor layer consists of at least one of the following elements: Te, Si, Ge, and Sn.

8. The light emitting semiconductor device of claim 2, wherein the dopant of said p-type III-nitride compound semiconductor layer consists of at least one of the following elements: Mg, Zn, and Cd.

9. The light emitting semiconductor device of claim 2, wherein said n-type III-nitride compound semiconductor layer is $Al_xIn_yGa_{1-x-y}N$, $0 \leq x+y \leq 1$.

10. The light emitting semiconductor device of claim 2, wherein said p-type III-nitride compound semiconductor layer is $Al_xIn_yGa_{1-x-y}N$, $0 \leq x+y \leq 1$.

11. A light emitting semiconductor device, comprising:
   a substrate;
   a III-nitride compound semiconductor layer on said substrate;
   a II-nitride compound single crystal-island layer on said III-nitride compound semiconductor layer;
   a first III-nitride compound semiconductor layer on said II-nitride compound single crystal-island layer;
   a III-nitride compound light emitting region on said first III-nitride compound semiconductor layer; and
   a second III-nitride compound semiconductor layer on said III-nitride compound light emitting region.

12. The light emitting semiconductor device of claim 11, wherein said first III-nitride compound semiconductor layer is an n-type III-nitride compound semiconductor layer; said second III-nitride compound semiconductor layer is a p-type III-nitride compound semiconductor layer.

13. The light emitting semiconductor device of claim 11, wherein the material of said substrate is selected from a group consisting of $Al_2O_3$, SiC, Si, and GaAs.

14. The light emitting semiconductor device of claim 11, wherein said II-nitride compound single crystal-island layer is made of at least one element selected from a group consisting of Be, Mg, Ca, Sr, Ba, Zn, Cd, and Hg.

15. The light emitting semiconductor device of claim 11, wherein the growing temperature of said II-nitride compound single crystal-island layer is between 200° C. and 1200° C.

16. The light emitting semiconductor device of claim 11, wherein said III-nitride compound semiconductor layer is $Al_xIn_yGa_{1-x-y}N$, $0 \leq x+y \leq 1$.

17. The light emitting semiconductor device of claim 11, wherein the structure of said III-nitride compound light emitting region is selected from a group consisting of double heterostructure, single quantum well, and multi-quantum well.

18. The light emitting semiconductor device of claim 12, wherein the dopant of said n-type III-nitride compound semiconductor layer consists of at least one of the following elements: Te, Si, Ge, and Sn.

19. The light emitting semiconductor device of claim 12, wherein the dopant of said p-type III-nitride compound semiconductor layer consists of at least one of the following elements: Mg, Zn, and Cd.

20. The light emitting semiconductor device of claim 12, wherein said n-type III-nitride compound semiconductor layer is $Al_xIn_yGa_{1-x-y}N$, $0 \leq x+y \leq 1$.

21. The light emitting semiconductor device of claim 12, wherein said p-type III-nitride compound semiconductor layer is $Al_xIn_yGa_{1-x-y}N$, $0 \leq x+y \leq 1$.

* * * * *